United States Patent
Simmons

(10) Patent No.: US 8,482,850 B2
(45) Date of Patent: Jul. 9, 2013

(54) MULTI-STAGE ERBIUM-DOPED FIBER AMPLIFIER WITH A SINGLE PROGRAMMABLE LOGIC DEVICE CONTROL CIRCUIT AND METHOD OF CONTROLLING THEREOF

(75) Inventor: Phil Simmons, Sterling, MA (US)

(73) Assignee: IPG Photonics Corporation, Oxford, MA (US)

( * ) Notice: Subject to any disclaimer, the term of this patent is extended or adjusted under 35 U.S.C. 154(b) by 875 days.

(21) Appl. No.: 12/415,805

(22) Filed: Mar. 31, 2009

(65) Prior Publication Data

US 2010/0245989 A1    Sep. 30, 2010

(51) Int. Cl.
*H04B 10/17* (2006.01)
*H01S 3/02* (2006.01)
*H04B 10/12* (2006.01)

(52) U.S. Cl.
USPC .............. 359/341.3; 359/341.4; 372/38.02; 372/38.04; 372/38.07

(58) Field of Classification Search
USPC .............. 359/341.3, 341.4; 372/38.02, 38.04, 372/38.07
See application file for complete search history.

(56) References Cited

U.S. PATENT DOCUMENTS

| | | | | |
|---|---|---|---|---|
| 5,268,786 A * | 12/1993 | Matsushita et al. | ...... | 359/341.33 |
| 5,459,328 A * | 10/1995 | Kadota et al. | ...... | 250/551 |
| 5,900,969 A * | 5/1999 | Srivastava et al. | ...... | 359/341.42 |
| 5,936,986 A * | 8/1999 | Cantatore et al. | ...... | 372/38.02 |
| 6,031,660 A * | 2/2000 | Park et al. | ...... | 359/341.4 |
| 6,366,393 B1 * | 4/2002 | Feulner et al. | ...... | 359/337 |
| 6,417,965 B1 * | 7/2002 | Ye et al. | ...... | 359/341.41 |
| 6,614,588 B1 * | 9/2003 | Uemura et al. | ...... | 359/341.4 |
| 6,798,801 B2 * | 9/2004 | Johnson | ...... | 372/38.02 |
| 6,940,882 B2 * | 9/2005 | Couch | ...... | 372/38.02 |
| 2003/0063641 A1 * | 4/2003 | Johnson | ...... | 372/38.04 |
| 2007/0201876 A1 * | 8/2007 | Sugaya | ...... | 398/141 |
| 2008/0130098 A1 * | 6/2008 | Ohtani et al. | ...... | 359/341.1 |

* cited by examiner

*Primary Examiner* — Eric Bolda
(74) *Attorney, Agent, or Firm* — Yuri Kateshov; Timothy J. King

(57) ABSTRACT

A control circuit for a fiber amplifier having a first stage pump and at least one second stage pump and method of controlling thereof is disclosed. The control circuit includes a control gate controlling a current through the first stage pump. A sensor for detecting a voltage across the first stage pump and providing a measured output of the voltage is provided. The control circuit further includes a control loop configured for selectively controlling the current through the control gate in accordance with the measured output and a set reference point is also provided.

11 Claims, 2 Drawing Sheets

MULTI-STAGE ERBIUM-DOPED FIBER AMPLIFIER WITH A SINGLE PROGRAMMABLE LOGIC DEVICE CONTROL CIRCUIT AND METHOD OF CONTROLLING THEREOF

BACKGROUND OF THE DISCLOSURE

1. Field of the Disclosure

The present patent document relates generally electronic control circuits for rare-earth-doped fiber amplifiers ("EDFA") and more specifically to a control circuit for a multi-stage EDFA using a single programmable logic device ("PLD").

2. Background of the Related Art

Use of fiber optics in the telecommunications industry to deliver data, such as television programming and high speed internet access, is becoming more prevalent. In order to transmit such data over long distances without undue signal deterioration fiber amplifiers are used. More specifically, multi-stage fiber amplifiers are used to boost the signal strength to sufficient power. Multi-stage fiber amplifiers include a first stage pump with one or more boosting stages. FIG. 1 shows a diagram of a prior art two-stage EDFA at 10. The first stage pump 12 boosts the signal to sufficient strength so that the second stage pump 14 does not introduce excess noise. Both pumps may include one or more diodes configured to pump an optical fiber. Power is supplied by a power supply 16. The amplification of the first stage pump 12 is controlled by a first gate 18. The amplification of the second stage pump is controlled by a second gate 20. Both gates 18, 20 may be field-effect transistors (or "FETs").

However, this prior art technique of amplifying a signal suffers from a couple of disadvantages. Specifically, the power requirement of the second stage pump 14 is larger than power requirements of the first stage pump. As a consequence, the power supply 16 provides excess power that must be bled off of the first stage pump 12. This situation results in the requirement for enhanced cooling and heavier duty components, which significantly increase the cost of the fiber amplifier control circuit 10. Moreover, the FETs typically used as gates 18, 20 may fail causing the fiber amplifier control circuit 10 to malfunction.

Referring to FIG. 2, another prior art fiber amplifier control circuit is shown generally at 100. The second control circuit includes a first stage pump 102 and a second stage pump 104. Power is supplied by a power supply 106. The amplification of the first stage pump 102 is controlled by a first gate 108. The amplification of the second stage pump 104 is controlled by a second gate 110. Both gates 108, 110 may be a FET. Unlike the first prior art control circuit 10, the second prior art control circuit 100 includes a DC/DC power converter 112 connected between the power supply 106 and the first stage pump 102. The power converter 112 step-down the power from the power supply to an amount within tolerance for the first stage pump 102. As a consequence, the first gate 108 is operated within acceptable tolerances and risk of failure is averted.

However, this prior art solution is also not without its problems. The second control circuit 100 still requires two separate control inputs at the first and second gates 108, 110. These control inputs are provided by a microprocessor (not shown). Also, although the second control circuit 100 requires less robust components, the solution essentially shifts the costs to the requirement of an additional power supply with the inclusion of the converter 112.

Accordingly, it is desirable in the art to remove the need to use two PLD control circuits in multi-stage EDFAs.

It is also desirable to simplify power supply requirements and reduce processor load.

SUMMARY OF THE DISCLOSURE

The fiber amplifier control circuit of the present disclosure solves the problems of the prior art by providing a control circuit that includes a control gate controlling a current through the first stage pump. A sensor for detecting a voltage across the first stage pump and providing a measured output of the voltage is provided. The control circuit further includes a control loop configured for selectively controlling the current through the control gate in accordance with the measured output and a set reference point is also provided.

Among the needs met by the present disclosure is the provision for a control circuit for a fiber amplifier that reduces the cost of manufacturing a fiber amplifier.

Also among the needs met by the present disclosure is the provision for a control circuit for a fiber amplifier that generates less heat thereby minimizing cooling requirements and extending the longevity of the components.

Also among the needs of the present disclosure is the provision for a control circuit for a fiber amplifier that eliminates the need for multiple control circuits to control a multi-stage fiber amplifier.

Also among the needs satisfied by the present disclosure is the provision for a control circuit that reduces processor load for controlling a fiber amplifier.

BRIEF DESCRIPTION OF THE DRAWINGS

These and other features, aspects, and advantages of the present disclosure will become better understood with reference to the following description, appended claims, and accompanying drawings where:

SPECIFIC DESCRIPTION

Figure 1:
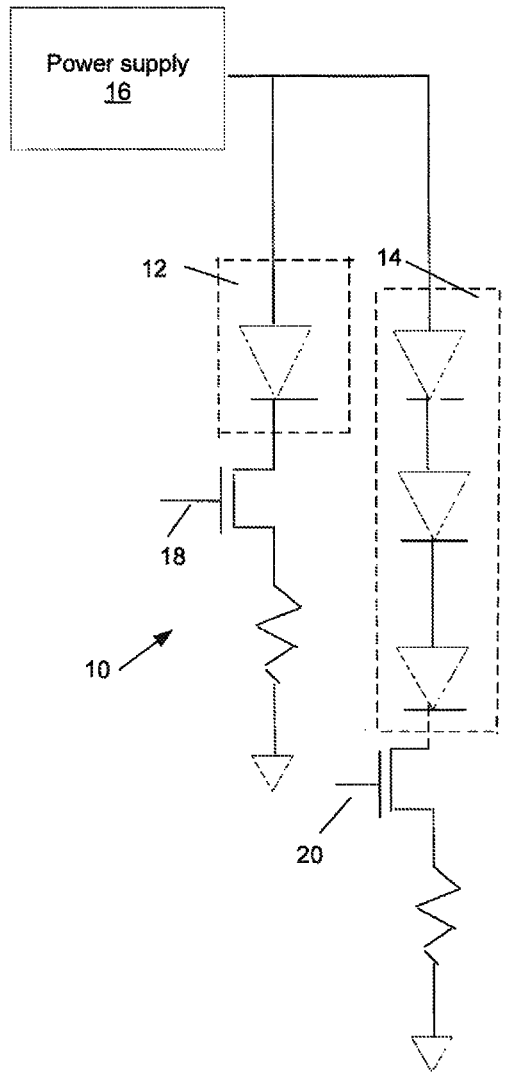
FIG. 1 is a diagram of a prior art control circuit for a multi-stage EDFA.
Figure 2:
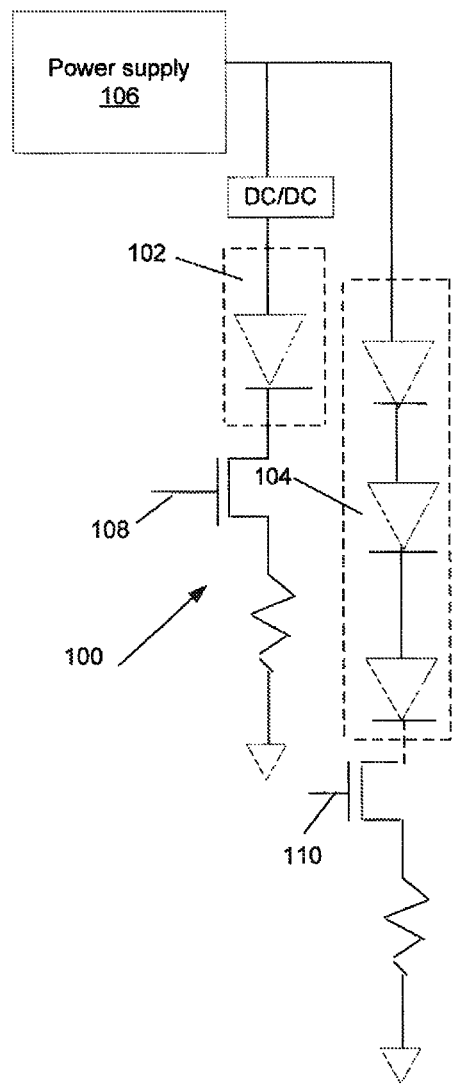
FIG. 2 is a diagram of another prior art control circuit for a multi-stage EDFA.
Figure 3:
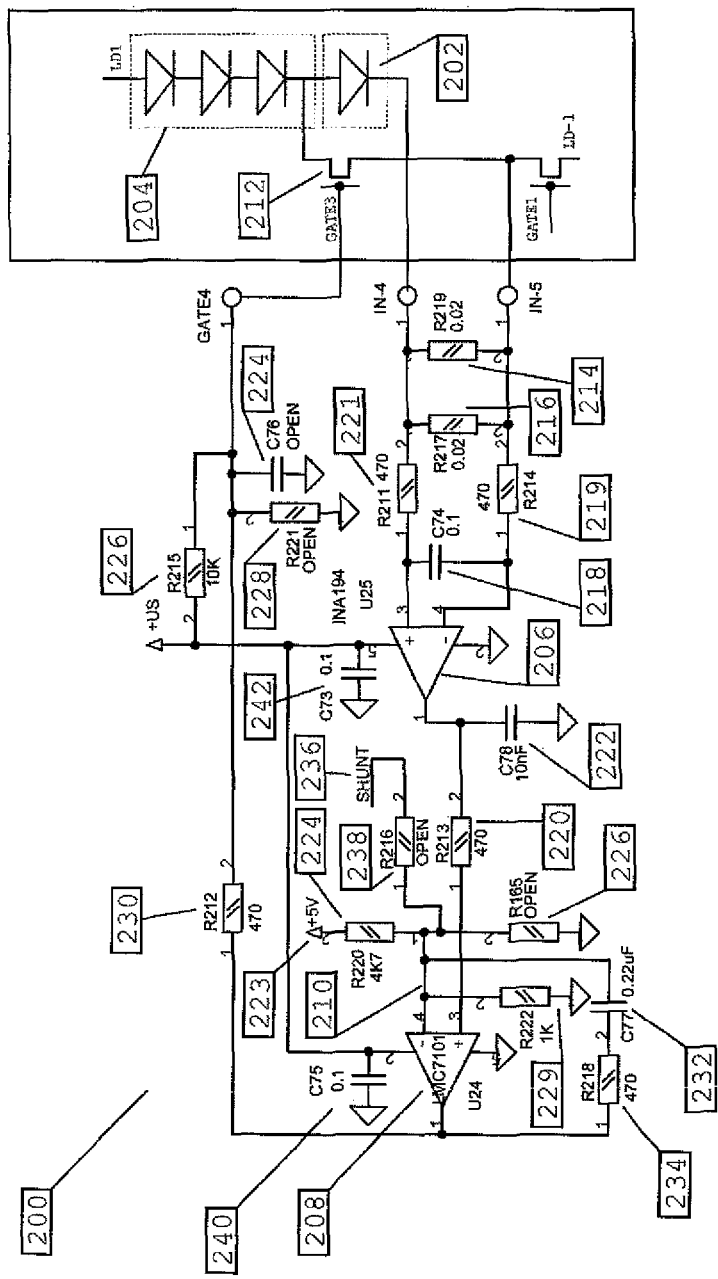
FIG. 3 is a diagram of a preferred embodiment of a control circuit for a multi-stage EDFA of the present disclosure.

Referring to FIG. 3, the fiber amplifier control circuit of the present disclosure is shown generally at 200. The control circuit 200 is configured to control a fiber amplifier having a first stage pump 202 and at least one second stage pump 204. In telecommunications applications, the first stage pump 202 is typically a low power diode (roughly 1.6 Amps) with an output in the 15 dBm operating range. The second stage pump 204 operates at higher power (roughly 3-4 Amps) to boost the output of the first stage pump sufficiently for long distance transmission. As will be described in greater detail below, the control circuit 200 of the present disclosure operates by sensing the current running through the first stage pump 202 with a sensor 206. The sensor 206 passes the measured current represented by voltage to a control loop 208. In the control loop 208, the measured voltage is compared against a voltage at a set reference point 210. The control loop 208 operates a control gate 212 that varies the current of the first stage pump 202 by shunting the latter in accordance with the comparison of the measured voltage against the set reference point 210.

More specifically, the control gate 212, such as a field-effect transistor (or "FET") is used to control the voltage across the first stage pump 202. For instance a STF20NF06 FET could be used. The control gate 212 controls the current passing through the first stage pump 202. For example the source of the FET may be connected to the anode of the diode use in the first stage pump 202. An operational amplifier (or "Op-Amp") may be used for amplifying the measured by the current sensor. Specifically, the sensor includes two resistors 214, 216, respectively which are coupled to one another in parallel and both in series to pump 202. The sensor is configured thus to measure the current through the output of pump 202. The voltage signal representing the measured current is coupled into an operational amplifier ("Op-Amp").

The current path of the first stage pump 202 is maintained through resistors 214, 216 across the $V_+$ and $V_-$ of the Op-Amp of the sensor. Resistors 214, 216 are preferably 0.02 Ω[Ohms]. A 0.1 uF [micro Farad] capacitor 218 is placed across the $V_+$ and $V_-$ of the Op-Amp of the sensor 206 to dampen or smooth the fluctuations in the current through the first stage pump 202. Additional 470Ω resistors 219, 221 may be included to increase the filtering provided by 218.

The output of the Op-Amp 206 is a measured output of the current through the first stage pump 202. In the preferred embodiment, the $V_{out}$ Op-Amp supplies the measured voltage.

As mentioned earlier the control loop 208 of the control circuit compares the measured output amplified by Op-Amp 206 against a voltage at a set reference point 210. In a preferred embodiment a second Op-Amp may be used as the control loop 208. For instance, a general purpose Op-Amp may be used. Specifically, $V_+$ of the Op-Amp of the control loop 208 is connected to the $V_{out}$ of the Op-Amp of the sensor 206. A 470Ω resistor 220 may be included. Moreover, a 10 nF capacitor 222 connected to a current drain may be included to further dampen fluctuations in $V_{out}$ of the Op-Amp of the Op-Amp 206. The $V_-$ of the Op-Amp of the control loop 208 is connected to the set reference point 210. The voltage value of the set reference point 210 is determined by a pair of resistors 224, 226 placed across a constant reference voltage 228. In a typical configuration, resistor 224 would be 4.7KΩ and resistor 226 would be 1KΩ, which would set the set reference point voltage to 480 mV. In the preferred embodiment the reference voltage is +5V. A 1KΩ resistor 229 connected to a current drain is also provided to insure the set point has a preset threshold.

$V_{out}$ of the Op-Amp of the control loop 20X is connected to the gate of the FET of the control gate 212 and also as a feedback loop back into $V_-$ of the Op-Amp of the control loop 208. The connection to the control gate 212 may further include a 0.1 uF capacitor 224, 10KΩ resistor 226 connected to a current source and a 100KΩ resistor 228 to a current drain are provided to stabilize erratic fluctuations in $V_{out}$ of the Op-Amp of the control loop 208. An additional 470Ω resistor 230 may be included between the Op-Amp of the control loop 208 and the control gate 212. Similarly, the feedback loop may further include a 0.22 μF capacitor 232 and 470Ω resistor 234 to dampen erratic fluctuations in the feedback current. Furthermore the feedback loop causes the control loop 208 to provide an output voltage that is proportional to the integral of input voltage.

Optionally, the control loop may further include a shunt 236. In the preferred embodiment, the shunt 236 is through a resistor 238 connected to $V_-$ of the Op-Amp of the control loop. A PLD (not shown) provides the shunt 236 voltage, which overrides the set reference point 210 and replaces it. In this manner, the control loop 208 may be set to another more desirable reference point for operating the fiber amplifier in a non-standard mode. For instance, it may be desirable to operate the fiber amplifier in a range below 15 dBm or in a range above 15 dBm in certain telecommunications industry applications to avoid interference or noise with the more standard 15 dBm transmission range.

Power is supplied to both the Op-Amp of the control loop 208 and the Op-Amp of the sensor 206. A pair of 0.1F capacitors 240, 242 are provided to stabilize the power for both the control loop 208 and the sensor 206 OP-Amps.

Therefore, it can be seen that the present disclosure provides a unique solution to the problem of using a single control circuit to operate a multi-stage EDFAs. Moreover, the control circuit of the present disclosure also, simplifies the power supply requirements and reduces processor load of fiber amplifiers. This advantage in turn reduces the cost of manufacturing and operating fiber amplifiers.

It would be appreciated by those skilled in the art that various changes and modifications can be made to the illustrated embodiments without departing from the spirit of the present disclosure. All such modifications and changes are intended to be within the scope of the present disclosure except as limited by the scope of the appended claims.

What is claimed is:

1. A control circuit for a multi-stage fiber amplifier having a first stage pump and at least one second stage pump, the control circuit comprising:
   a control gate controlling a current through the first stage pump;
   a feedback loop including a sensor coupled to the first stage pump in series and configured to measure the current, the feedback loop being configured to guide the measured current along a current path downstream from the sensor; and
   a control loop receiving a voltage signal, which represents the measured current, from the feedback loop and configured to match the measured voltage to a reference point so as to selectively close the control gate thereby controlling the current through the first stage pump.

2. The control circuit of claim 1, further comprising a shunt providing a reference value to the control loop to be used as the set reference point.

3. The control circuit of claim 2, wherein the value provided by the shunt is provided by a programmable logic device.

4. The control circuit of claim 1, wherein the set reference point is determined by a pair of resistor values across a constant voltage.

5. The control circuit of claim 1, wherein fiber amplifier is a rare earth-doped fiber amplifier.

6. The control circuit of claim 5, wherein the fiber amplifier is a two-stage rare earth-doped fiber amplifier.

7. The control circuit of claim 1, wherein said sensor includes two resistors coupled in parallel to one another.

8. The control circuit of claim 1, wherein said control loop is an operational amplifier.

9. The control circuit of claim 1, wherein said control gate is a field-effect transistor.

10. A method of controlling a multi-stage fiber amplifier having a first stage pump and at least one second stage pump, the first stage pump having a control gate controlling a current there through, the method comprising:
    measuring the current running through the first stage pump using a sensor, said sensor providing a measured current output;
    running the measured current through a feedback loop;
    coupling the measured current into a control loop;

comparing a voltage representing the measured current against a set reference voltage using the control loop, said control loop providing a control output; and selectively operating the control gate of the first stage pump in accordance with the control output, thereby selectively running the current through the first stage pump.

11. The method of claim 10, further comprising:

calculating a reference value with a programmable logic device; and overriding said set reference voltage with the reference value;

whereby said control loop compares said measured voltage output with said reference value instead of said set reference voltage.

* * * * *